(12) United States Patent
Lee et al.

(10) Patent No.: US 6,673,714 B2
(45) Date of Patent: Jan. 6, 2004

(54) METHOD OF FABRICATING A SUB-LITHOGRAPHIC SIZED VIA

(75) Inventors: Heon Lee, Sunnyvale, CA (US); Thomas C. Anthony, Sunnyvale, CA (US); Lung T. Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/133,605

(22) Filed: Apr. 25, 2002

(65) Prior Publication Data

US 2003/0211729 A1 Nov. 13, 2003

(51) Int. Cl.[7] ................... H01L 21/4763; H01L 21/302; H01L 21/461; G03C 5/00
(52) U.S. Cl. ................. 438/637; 438/640; 438/739; 438/947; 430/312
(58) Field of Search ................. 438/717, 725, 438/739, 947, 637–640; 430/312

(56) References Cited

U.S. PATENT DOCUMENTS

| | | | | |
|---|---|---|---|---|
| 4,503,599 A | * | 3/1985 | Ueyanagi et al. | 438/183 |
| 4,694,564 A | * | 9/1987 | Enoki et al. | 438/167 |
| 4,711,701 A | * | 12/1987 | McLevige | 438/183 |
| 4,732,871 A | * | 3/1988 | Buchmann et al. | 438/183 |
| 4,808,545 A | * | 2/1989 | Balasubramanyam et al. | 438/183 |
| 4,980,317 A | * | 12/1990 | Koblinger et al. | 438/717 |
| 4,997,778 A | * | 3/1991 | Sim et al. | 438/182 |
| 5,663,100 A | * | 9/1997 | Park et al. | 438/586 |
| 5,976,920 A | * | 11/1999 | Nakano et al. | 438/172 |
| 6,036,875 A | * | 3/2000 | Lin | 216/51 |

* cited by examiner

*Primary Examiner*—Erik J. Kielin
(74) *Attorney, Agent, or Firm*—Trueman H. Denny, III

(57) ABSTRACT

A method of fabricating a sub-lithographic sized via is disclosed. A dual-polymer method is used to form a stacked layer of polymer materials wherein a first polymer layer has a first etch rate and a second polymer layer has a second etch rate. The first etch rate is preselected to be faster than the second etch rate when the first and second polymer layers are isotropically etched. The second polymer layer is made from a photo active material and is operative as an etch mask for the first photoresist layer. The etching is continued until the first polymer layer has a sub-lithographic feature size that is less than a lithography limit of a lithography system. A dielectric material is deposited on the etch mask and the first polymer layer. The first polymer layer is lifted-off to define a sub-lithographic sized via.

14 Claims, 4 Drawing Sheets

METHOD OF FABRICATING A SUB-LITHOGRAPHIC SIZED VIA

FIELD OF THE INVENTION

The present invention relates generally to a method of fabricating a sub-lithographic sized via in which a resulting sub-lithographic feature size of the via is less than a lithography limit of a lithographic system. More specifically, the present invention relates to a method of fabricating a sub-lithographic sized via using dual polymer layers with different etch rates to form a via having a sub-lithographic feature size that is is less than a lithography limit of a lithographic system.

BACKGROUND OF THE ART

A standard method in the microelectronics industry for patterning features on a substrate uses well understood photolithographic processes. Typically, a layer of photoresist is coated onto a substrate material followed by exposing the photoresist with a light source through a mask. The mask includes patterned features, such as lines and spaces, that are to be transferred to the photoresist. After the photoresist is exposed, a solvent is used to define the patterns that were transferred to the photoresist. The patterns produced by this process are typically limited to line widths greater than a minimum resolution $\lambda$ of a photolithographic alignment tool, which is ultimately limited by a wavelength of light of a light source used to expose the photoresist. At present, a state of the art photolithographic alignment tool is capable of printing line widths as small as 100 nm.

Features patterned into the photoresist are transferred into the substrate material using well known semiconductor processes such as reactive ion etching, ion milling, plasma etching, or chemical etching. Using standard semiconductor processing methods, a line width of $\lambda$ or a grating (i.e. a line-space sequence) with a period of $2\lambda$ can be created.

However, in many applications it is advantageous to have the line width or the period be as small as possible. Smaller line widths or periods translate into higher performance and/or higher density circuits. Hence, the microelectronics industry is on a continual quest to reduce the minimum resolution in photolithography systems and thereby reduce the line widths or periods on patterned substrates. The increases in performance and/or density can be of considerable economic advantage because the electronics industry is driven by a demand for faster and smaller electronic devices. A via is just one example of an application in which it is desirable to have a feature size (i.e. a sub-lithographic feature size) that is smaller than the minimum resolution $\lambda$.

Consequently, there exists a need for a method of fabricating a sub-lithographic sized via having a features size that is smaller than a minimum resolution of a photolithographic system.

SUMMARY OF THE INVENTION

The method of fabricating a sub-lithographic sized via of the present invention fulfills the aforementioned need for a feature size that is smaller than a minimum resolution of a photolithographic system.

The feature size limitations imposed by the minimum resolution of a photolithographic system are solved by depositing a first polymer layer on an underlying layer followed by depositing a second polymer layer on the first polymer layer. The first polymer layer need not be photo active. On the other hand, the second polymer layer must be photo active so that it can be exposed with a pattern. The second polymer layer is lithographically patterned to define an etch mask therein having a feature size that is within a lithography limit of a lithographic system used to pattern the second polymer layer. An etch process is used to remove all of the first polymer layer except those portions of the first polymer layer that are positioned under the etch mask.

A remaining portion of the first polymer layer has a first etch rate and the second polymer layer (i.e. the etch mask) has a second etch rate. The first etch rate is preselected to be faster than the second etch rate when the first and second polymer layer are isotropically etched. The etch mask and the first polymer layer are isotropically etched so that the first polymer layer dissolves in a substantially lateral direction at a faster rate than the etch mask. The first polymer layer recedes along the surface of the underlying layer defining an exposed surface on the underlying layer and the first polymer layer recedes along the etch mask defining an undercut portion on the etch mask. The isotropic etching is continued until the first polymer layer has dissolved to a sub-lithographic feature size that is less than the lithography limit.

A dielectric layer is then deposited on the exposed portion and on substantially all of the etch mask except the undercut portion. The dielectric layer forms a via sidewall positioned adjacent to the first polymer layer. The etch mask and the first polymer layer are removed by a lift-off process to define a sub-lithographic sized via including a minimum feature size that is substantially equal to the sub-lithographic limit.
dr Other aspects and advantages of the present invention will become apparent from the following detailed description, taken in conjunction with the accompanying drawings, illustrating by way of example the principles of the present invention.

DETAILED DESCRIPTION

Figure 1:
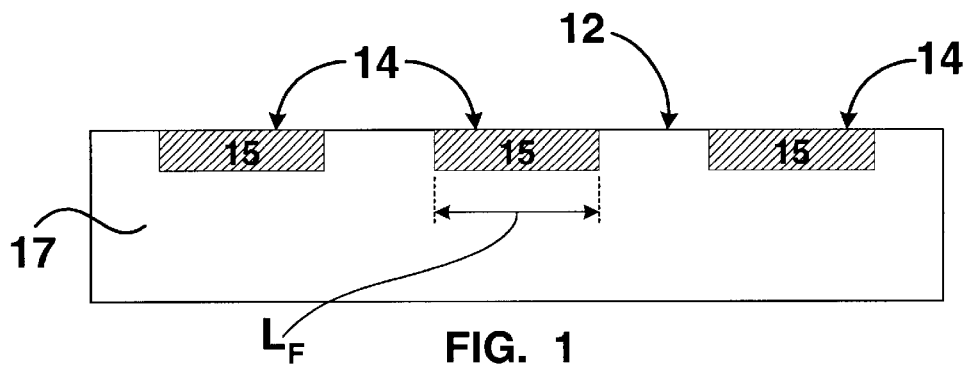
FIG. 1 is a cross-sectional view of a underlying layer according to the present invention.

In the following detailed description and in the several figures of the drawings, like elements are identified with like reference numerals.

As shown in the drawings for purpose of illustration, the present invention is embodied in a method of fabricating a sub-lithographic sized via. The method includes depositing a first polymer layer including a first etch rate on a surface of an underlying layer and then depositing a second polymer layer including a second etch rate on the first polymer layer. The first etch rate is preselected to be faster than the second etch rate when the first and second polymer layers are isotropically etched. The second polymer layer is photolithographically patterned to define an etch mask in the second polymer layer. The etch mask includes a feature size that is within a lithography limit of a lithographic system that was used for patterning the second polymer layer. If the lithography limit of the lithographic system is $\lambda_L$, then the feature size of the etch mask is greater than or equal to $\lambda_L$.

The first polymer layer is anisotropically etched to dissolve portions of the first polymer layer that are not covered by the etch mask. As a result, after the anisotropic etch, the first polymer layer and the etch mask form a dual-polymer stacked layer that extends outward of the underlying layer.

The first polymer layer and the etch mask are isotropically etched such that the first polymer layer dissolves in a substantially lateral direction at a faster rate than the etch mask. For example, plasma etching in an oxygen-containing plasma could be used to etch the polymers. The first polymer layer recedes along the surface of the underlying layer and defines an exposed surface on the underlying layer. The first polymer layer also recedes along the etch mask and defines an undercut portion thereon. The isotropic etching is continued until the first polymer layer has dissolved to a sub-lithographic feature size that is less than the lithography limit. Essentially, after the isotropic etch, the etch mask and the sub-lithographic feature size of the first polymer layer form a structure that is analogous to an umbrella or a mushroom that over-spans the sub-lithographic feature size of the first polymer layer and a portion of the exposed surface of the underlying layer.

A dielectric layer is deposited on the exposed portion of the underlying layer and on substantially all of the etch mask except the undercut portion such that a top surface and a side surface of the etch mask are substantially covered by the dielectric layer. However, a bottom surface (i.e the undercut portion) of the etch mask is not covered by the dielectric layer. Moreover, the dielectric layer that is deposited on the exposed portion forms a via sidewall positioned adjacent to the first polymer layer.

The etch mask and the first polymer layer are lifted-off to define a sub-lithographic sized via including a minimum feature size that is substantially equal to the sub-lithographic feature size.

In FIG. 1, a substrate 17 carries an underlying layer 15 therein. A surface 14 of the underlying layer 15 is depicted as being flush with an upper surface 12 of the substrate 17. However, the underlying layer 15 and the surface 14 need not be flush with each other and the underlying layer 15 can have a non-planar surface. The substrate 17 can be a layer of a dielectric material such as silicon oxide ($SiO_2$) or silicon nitride ($Si_3N_4$), for example. The underlying layer 15 includes a feature size $L_F$ that is substantially greater than or equal to a lithography limit $\lambda_L$ of a lithographic system used to pattern the underlying layer 15. For example, if $\lambda_L$=0.20 $\mu$m, then $L_F \geq \lambda_L$ and $L_F \geq 0.20$ $\mu$m. For instance, the underlying layer 15 can be formed in the substrate 17 by a variety of methods that are well understood in the microelectronics art including chemical mechanical planarization (CMP) or a damascene process if it is desired to have a substantially planar and flush surfaces for underlying layer 15 and the surface 14.

Figure 8A:
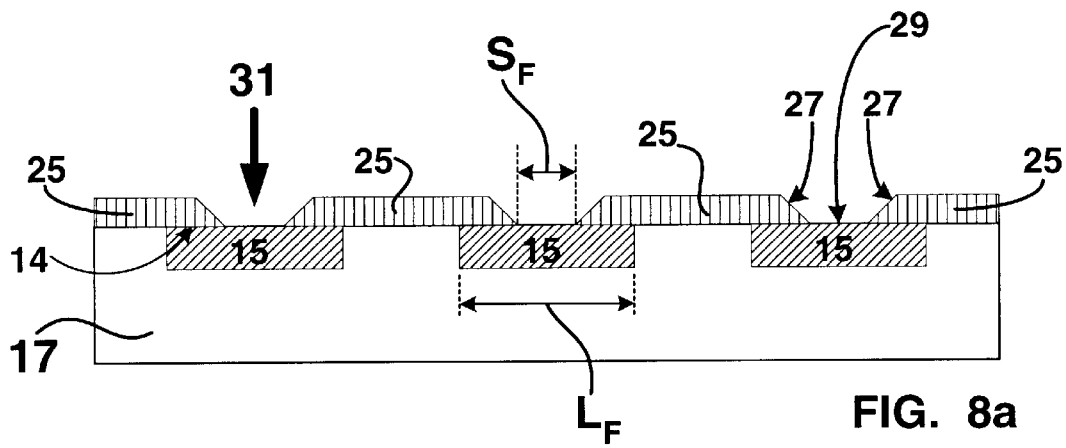
FIGS. 8a and 8b are cross-sectional views of a sub-lithographic sized via according to the present invention.
Figure 8B:
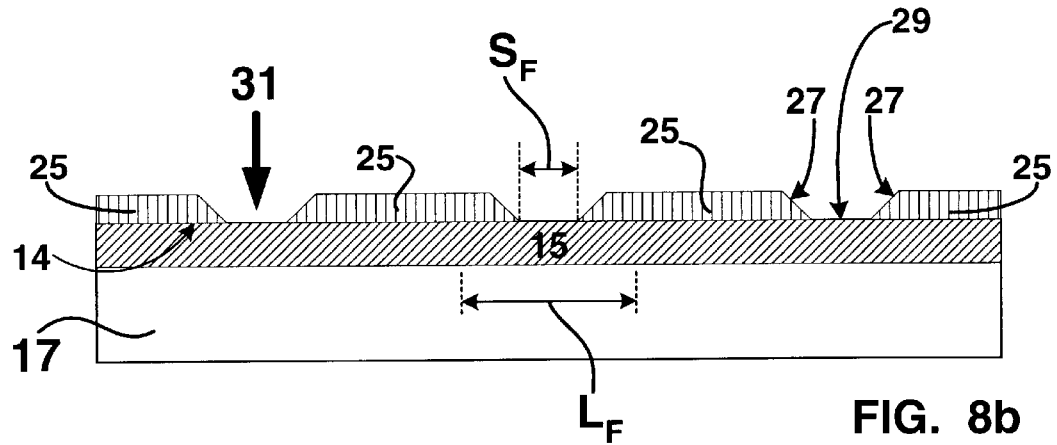

The underlying layer 15 may be patterned into discrete segments as depicted in FIG. 1 or the underlying layer 15 may be a continuous layer (see reference numeral 15 in FIG. 8b). In either case, the underlying layer 15 includes the feature size $L_F$ that is substantially greater than or equal to a lithography limit $\lambda_L$.

The underlying layer 15 can be an electrically conductive material. Suitable materials for the underlying layer 15 include but are not limited to a metal, aluminum (Al), tungsten (W), titanium (Ti), molybdenum (Mo), and copper (Cu).

Figure 2:
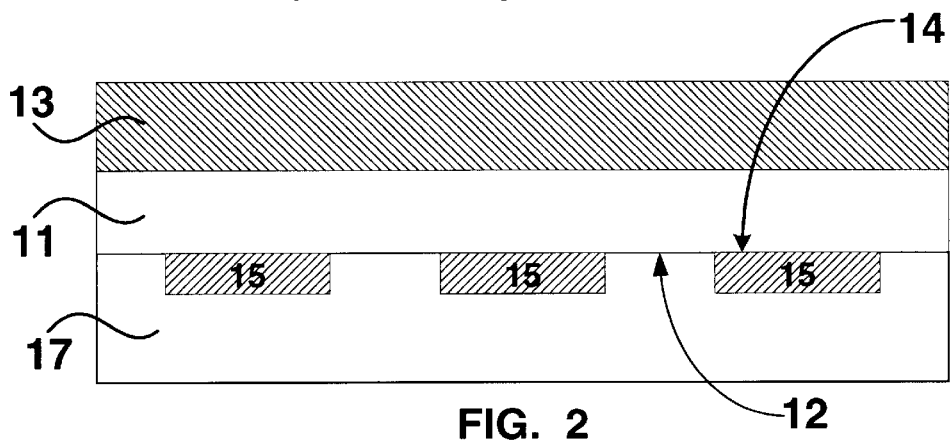
FIG. 2 is a cross-sectional view depicting a second polymer layer that has been deposited on a first polymer layer according to the present invention.

In FIG. 2, a first polymer layer 11 is deposited on the surface 14 of the underlying layer 15. The first polymer layer 11 need not be photo active. The first polymer layer 11 has a first etch rate when the first polymer layer 11 is isotropically etched.

Next, a second polymer layer 13 is deposited on the first polymer layer 11. The second polymer layer 13 must be photo active so that the second polymer layer 13 can be photolithographically patterned. The second polymer layer 13 has a second etch rate when the second polymer layer 13 is isotropically etched. The first etch rate is preselected to be faster than the second etch rate when the first and second polymer layers (11, 13) are isotropically etched.

As an example, the first etch rate of the first polymer layer 11 can be at least about 10.0% faster than the second etch rate of the second polymer layer 13. As another example, the first etch rate of the first polymer layer 11 can be from about 10.0% faster to about 20.0% faster than the second etch rate. That is, a lateral etch rate of the first polymer layer 11 can be from about 10.0% faster to about 20.0% faster than a lateral etch rate of the second polymer layer 13 when the first and second polymer layers (11, 13) are isotropically etched. The aforementioned values are an example only and the relative differences between the first etch rate and the second etch rate are not limited to those values.

The first polymer layer 11 and the second polymer layer 13 can be photo active polymers, although the first polymer layer 11 need not necessarily be a photo active material. In contrast, the second polymer layer 13 must be a photo active material such as a photo active photoresist material, for example.

Figure 3:
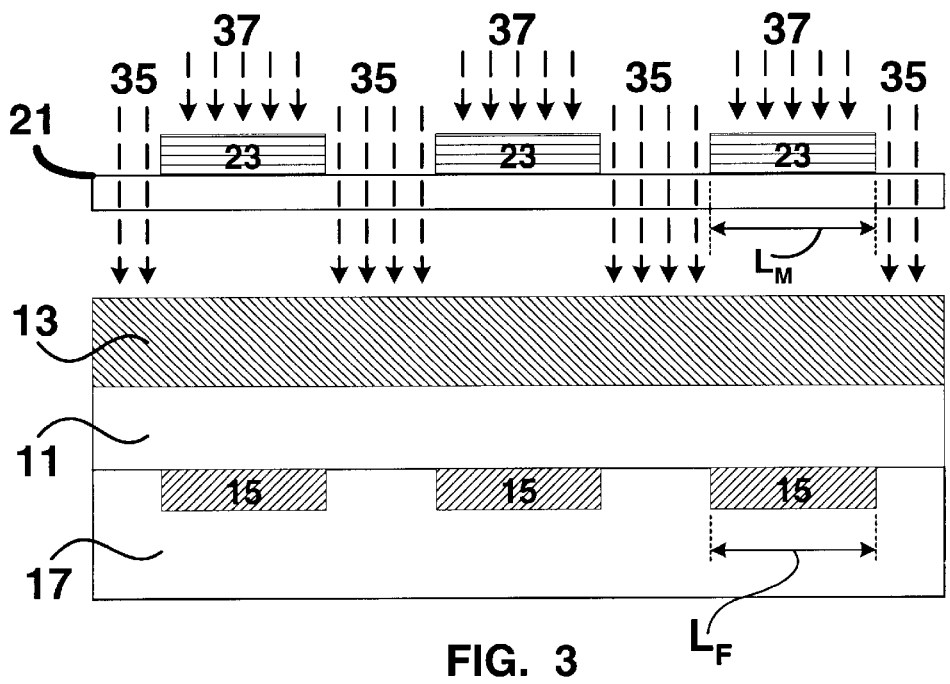
FIG. 3 is a cross-sectional view of patterning the second polymer layer to define an etch mask therein according to the present invention.

In FIG. 3, the second polymer layer 13 is lithographically patterned. For example, a mask 21 having a feature 23 thereon with a mask feature size $L_M$ that is greater than or equal to a lithography limit $\lambda_L$ of a lithographic system used to pattern the second polymer layer 13 is illuminated by light (35, 37) from a light source (not shown). The mask feature size $L_M$ can be substantially equal to the feature size $L_F$. A portion of the light 37 is blocked by the feature 23 while another portion of the light 35 passes through the mask 21 and exposes the second polymer layer 13. A portion of the second polymer layer 13 that is not exposed by the light defines an etch mask (see reference numeral 19 in FIG. 4a) in the second polymer layer 13. Conversely, a material for the second polymer layer 13 can be selected such that those portions of the second polymer layer 13 that are exposed to the light 35 define the etch mask 19. The etch mask 19 has a feature size $L_F$ that is within the lithography limit $\lambda_L$ (i.e. $L_F \geq \lambda_L$) of a lithographic system used to pattern the etch mask 19.

Figure 4A:
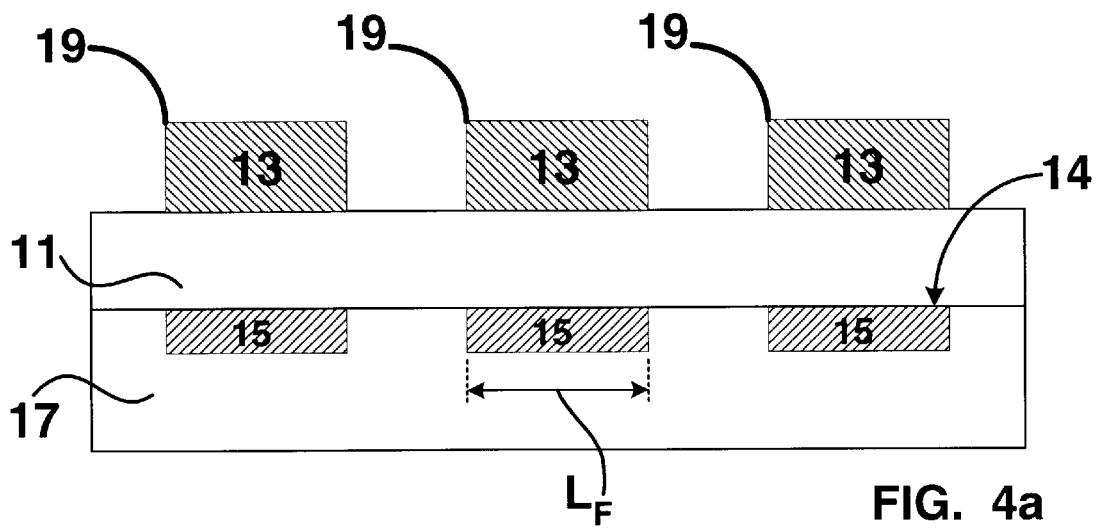
FIGS. 4a and 4b are cross-sectional views of a first polymer layer positioned under an etch mask according to the present invention.
Figure 4B:
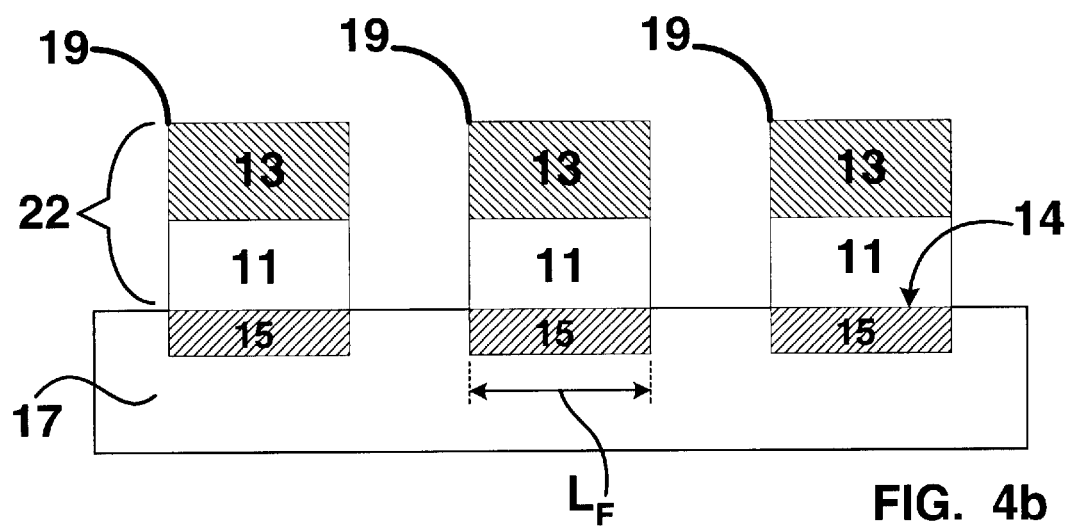

In FIG. 4a, the second polymer layer 13 is anisotropically etched, typically in a photoresist developer solution, to dissolve all of the second polymer layer 13 except the etch mask 19. In FIG. 4b, the etching is continued until those portions of the first polymer layer 11 that are not covered by the etch mask 19 are also dissolved. As a result, the etch mask 19 and the first polymer layer 11 form a dual-polymer stacked layer 22 that extends outward of the underlying layer 15. A developer, a solvent, or reactive ion etching can be used to anisotropically etch the first and second polymer (11, 13) layers, for example.

Figure 5:
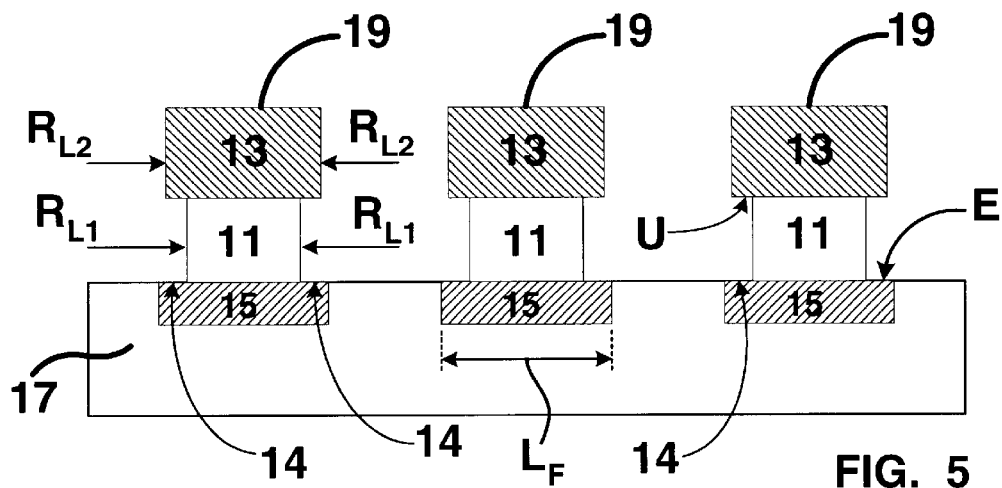
FIGS. 5 and 6 are cross-sectional views of an isotropic etch of the first polymer layer and the etch mask according to the present invention.

In FIG. 5, the first polymer layer 11 and the etch mask 19 are isotropically etched. As the isotropic etching proceeds, the first polymer layer 11 dissolves in a substantially lateral direction $R_{L1}$ at a faster rate than the etch mask 19 which also dissolves in a substantially lateral direction $R_{L2}$. Furthermore, as the first polymer layer 11 dissolves, it also recedes along the surface 14 of the underlying layer 15 and defines an exposed portion E that is not covered by the first polymer layer 11. The first polymer layer 11 also recedes along the etch mask 19 and defines an undercut portion U thereon that is not covered by the first polymer layer 11. The faster rate of recession of the first polymer layer 11 relative to the slower recession rate of the etch mask 19 results in the first polymer layer 11 narrowing with respect to the feature size $L_F$.

The first polymer layer 11 and the etch mask 19 can be isotropically etched using an isotropic etching process that includes but is not limited to wet etching, plasma etching, and etching in a plasma comprising an oxygen ($O_2$) gas. Additionally, other gases including but not limited to argon (Ar) gas, helium (He) gas, and a fluorine (F) containing gas can be added individually or in combination to the oxygen ($O_2$) gas. The fluorine containing gas can include but is not limited to $CF_4$, $CHF_3$, $C_4F_8$, or $SF_6$.

Figure 6:
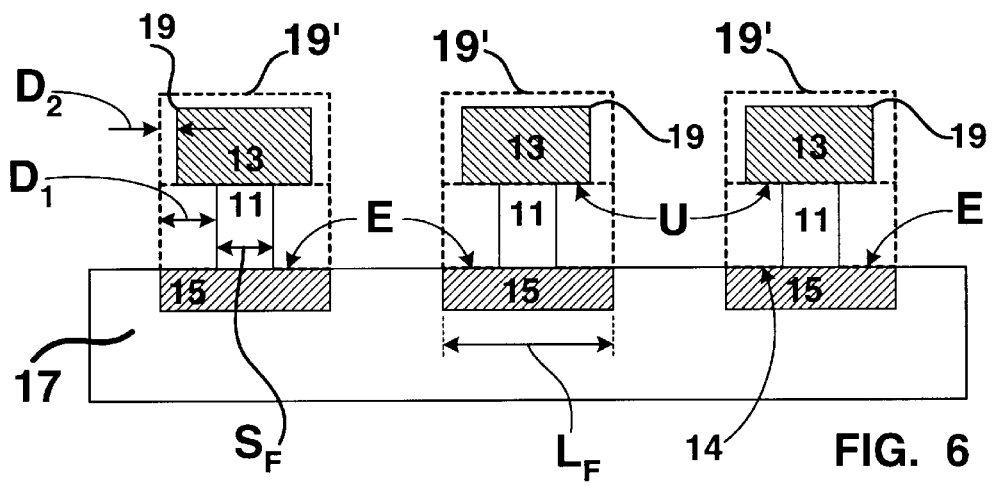

In FIG. 6, the isotropic etching continues until the first polymer layer 11 has dissolved to a sub-lithographic feature size $S_F$ that is less than the feature size $L_F$. Because of the differences in the first and second etch rates of the first polymer layer 11 and the etch mask 19, the etch mask 19 recedes a distance $D_2$ and the first polymer layer 11 recedes a distance $D_1$ that is greater than $D_2$. For purposes of illustration, both $D_1$ and $D_2$ are measured relative to an outline 19' (shown in dashed line) that represents an outline of the first polymer layer 11 and the etch mask 19 prior to the isotropic etching. The final value for the sub-lithographic feature size $S_F$ will be application dependent and can vary due to a number of factors including the materials selected for the first and second polymer layers (11, 13) and the conditions and materials selected for the isotropic etch process. The final value of the sub-lithographic feature size $S_F$ should be selected so that it is not less than a minimum value that would result in breakage or toppling of the first polymer layer 11 due to the mass of the etch mask 19 or the combined mass of the etch mask 19 and a dielectric layer 25 (see FIGS. 7a and 7b). For instance, the sub-lithographic feature size $S_F$ can be smaller than the feature size $L_F$ or the lithography limit $\lambda_L$ by a factor in a range from about 0.40 to about 0.80. As an example, if $L_F = \lambda_L = 0.12$ $\mu$m and the factor is 0.50, then $S_F = 0.50 * 0.12$ $\mu$m $= 0.060$ $\mu$m.

Figure 7A:
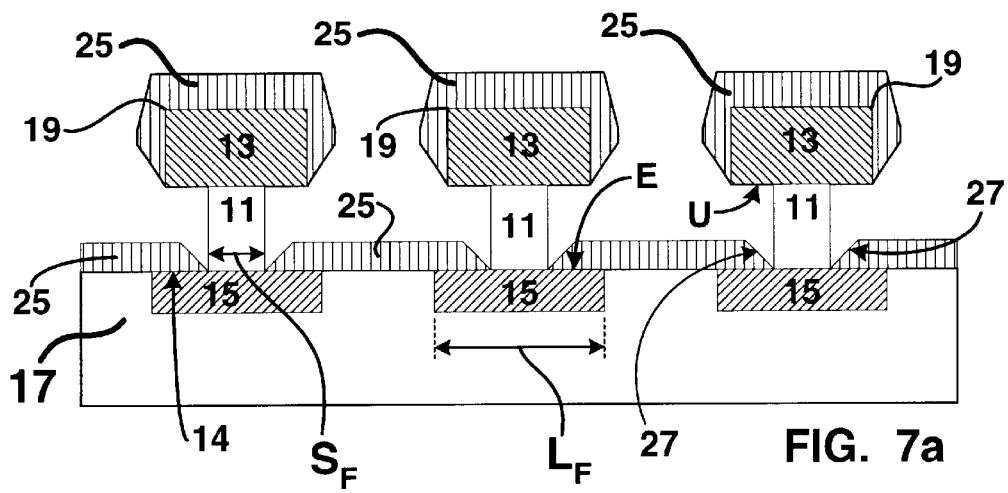
FIGS. 7a and 7b are cross-sectional views of a dielectric layer deposited on an etch mask and on an exposed portion according to the present invention.

In FIG. 7a, a dielectric layer 25 is deposited on the exposed portion E of the underlying layer 15 and on substantially all of the etch mask 19; however, the dielectric layer 25 does not cover the undercut portion U of the etch mask 19. The dielectric layer 25 forms a via sidewall 27 that is positioned adjacent to the first polymer layer 11. The dielectric layer 25 can be made from a material including but not limited to silicon oxide ($SiO_2$), aluminum oxide ($Al_2O_3$), zirconium oxide ($ZrO_2$), yttrium oxide ($Y_2O_3$), silicon nitride ($Si_3N_x$), and aluminum nitride (AlN), for example.

Figure 7B:
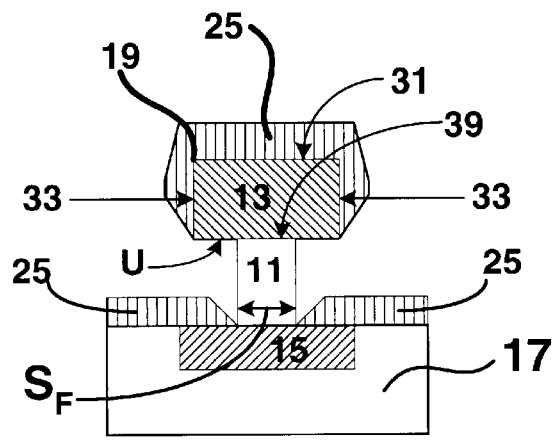

In FIG. 7b, the dielectric layer 25 covers a top surface 31 and side surfaces 33 of the etch mask 19, but the dielectric layer 25 does not cover a bottom surface 39 of the etch mask 19. The bottom surface 39 is coincident with the undercut portion U. The dielectric layer 25 can be deposited using chemical vapor deposition (CVD) or physical vapor deposition (PVD). Examples of PVD are sputtering or thermal evaporation. Preferably, the deposition process is a low temperature process when the materials selected for the first and second polymer layers (11, 13) are polymers that could degrade under a high temperature deposition process. Examples of polymers that can degrade at high temperatures include photoresist materials. Accordingly, the temperature selected for depositing the dielectric layer 25 should not exceed a temperature limit that would damage or destroy the first and second polymer layers (11, 13).

In FIG. 8a, the first polymer layer 11 and the etch mask 19 are lifted-off of the surface 14 of the underlying layer 15 to define a via 31 including a minimum feature size that is substantially equal to the sub-lithographic feature size $S_F$. That is, the via 31 has a sub-lithographic feature size. As an example, the lifting-off of first polymer layer 11 and the etch mask 19 can be accomplished using a solvent that dissolves the material used for the first polymer layer 11 or by using a solvent that dissolves the first polymer layer 11 and the etch mask 19. The via 31 has a bottom surface 29 that is coincident with the surface 14 and sidewall surfaces 27 that extended outward of the bottom surface 29.

As was mentioned above, the underlying layer 15 can be a continuous layer as is depicted in FIG. 8b where there are a plurality of the sub-lithographic sized vias 31 formed on the underlying layer 15. In FIGS. 8a and 8b, the underlying layer 15 includes the feature size $L_F$ that is substantially greater than or equal to a lithography limit $\lambda_L$. The actual value of the lithography limit $\lambda_L$ will be application dependent and can depend on factors including the photolithographic system used and the wavelength of light used, for example. In one embodiment of the present invention, the lithography limit $\lambda_L$ can be greater than or equal to about 0.10 $\mu$m.

As mentioned above, the actual value for the sub-lithographic feature size $S_F$ will also be application dependent and can depend on factors including the material for the first polymer layer 11 and an etch time for the isotropic etch process. In another embodiment of the present invention, the sub-lithographic feature size $S_F$ can be less than about 0.06 $\mu$m.

Although several embodiments of the present invention have been disclosed and illustrated, the invention is not limited to the specific forms or arrangements of parts so described and illustrated. The invention is only limited by the claims.

What is claimed is:

1. A method of fabricating a sub-lithographic sized via, comprising:

depositing a first polymer layer on a surface of an underlying layer, the first polymer layer including a first etch rate, and the underlying layer is an electrically conductive material;

depositing a second polymer layer on the first polymer layer, the second polymer layer is photo active and includes a second etch rate, and wherein the first etch rate is preselected to be faster than the second etch rate when the first and second polymer layers are isotropically etched;

patterning the second polymer layer to define an etch mask therein, the etch mask including a feature size that is within a lithography limit of a lithographic system used for the patterning;

anisotropically etching the first polymer layer to remove all portions of the first polymer layer that are not covered by the etch mask;

isotropically etching the first polymer layer and the etch mask such that the first polymer layer dissolves in a substantially lateral direction at a faster rate than the etch mask, the first polymer layer receding along the surface of the underlying layer defining an exposed surface thereon and receding along the etch mask defining an undercut portion thereon, and continuing the etching until the first polymer layer has dissolved to a sub-lithographic feature size that is less than the lithography limit;

depositing a dielectric layer on the exposed portion of the underlying layer and substantially all of the etch mask except the undercut portion, the dielectric layer forming a via sidewall positioned adjacent to the first polymer layer; and lifting-off the first polymer layer and the etch mask to define a via including a minimum feature size that is substantially equal to the sub-lithographic feature size.

2. The method as set forth in claim 1, wherein the underlying layer is a selected one of a plurality of discrete segments or a continuous layer.

3. The method as set forth in claim 1, wherein the electrically conductive material is a material selected from the group consisting of a metal, aluminum, tungsten, titanium, molybdenum, and copper.

4. The method as set forth in claim 1, wherein the lithography limit is greater than or equal to about 0.10 µm.

5. The method as set forth in claim 1, wherein the sub-lithographic feature size is less than about 0.06 µm.

6. The method as set forth in claim 1, wherein the sub-lithographic feature size is less than the lithography limit by a factor in a range from about 0.40 to about 0.80.

7. The method as set forth in claim 1, wherein the dielectric layer is deposited using a method selected from the group consisting of chemical vapor deposition, physical vapor deposition, sputtering, and thermal evaporation.

8. The method as set forth in claim 1, wherein the lifting-off step comprises dissolving the first polymer layer and the etch mask in a solvent.

9. The method as set forth in claim 1, wherein the isotropically etching step comprises a process selected from the group consisting of wet etching, plasma etching, and etching in a plasma comprising an oxygen gas.

10. The method as set forth in claim 9, wherein the oxygen gas includes a selected one or more of argon gas, helium gas, and a fluorine containing gas.

11. The method as set forth in claim 1, wherein the dielectric layer is a material selected from the group consisting of silicon oxide, aluminum oxide, zirconium oxide, yttrium oxide, silicon nitride, and aluminum nitride.

12. The method as set forth in claim 1, wherein the first etch rate of the first polymer layer is at least about 10.0% faster than the second etch rate of the second polymer layer.

13. The method as set forth in claim 1, wherein the first polymer layer comprises a material selected from the group consisting of a non-photo active polymer material and a photo active polymer material.

14. The method as set forth in claim 1, wherein the second polymer layer comprises a photo active photoresist material.

* * * * *